US008566679B2

(12) United States Patent
Gherman et al.

(10) Patent No.: US 8,566,679 B2
(45) Date of Patent: Oct. 22, 2013

(54) ERROR-CORRECTING ENCODING METHOD WITH TOTAL PARITY BITS, AND METHOD FOR DETECTING MULTIPLE ERRORS

(75) Inventors: Valentin Gherman, Massy (FR); Samuel Evain, Gif sur Yvette (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 155 days.

(21) Appl. No.: 13/147,567

(22) PCT Filed: Feb. 1, 2010

(86) PCT No.: PCT/EP2010/051192
§ 371 (c)(1),
(2), (4) Date: Aug. 25, 2011

(87) PCT Pub. No.: WO2010/089282
PCT Pub. Date: Aug. 12, 2010

(65) Prior Publication Data
US 2012/0110409 A1    May 3, 2012

(30) Foreign Application Priority Data
Feb. 3, 2009   (FR) ...................................... 09 00448

(51) Int. Cl.
*H03M 13/00*   (2006.01)
(52) U.S. Cl.
USPC ............................ 714/781; 714/767; 714/756
(58) Field of Classification Search
USPC .......... 714/781, 767, 773, 756, 762, 755, 758
See application file for complete search history.

(56) References Cited

U.S. PATENT DOCUMENTS 3,623,155 A    11/1971   Hsiao et al.
4,593,395 A *  6/1986   Schouhamer Immink et al. .............................. 714/755

(Continued)

FOREIGN PATENT DOCUMENTS

EP    1300952 A1    4/2003
EP    1300953 A1    4/2003

(Continued)

OTHER PUBLICATIONS

Penzo L. et al.: "Construction techniques for systematic SEC-DED codes with single byte error detection and partial correction capability for computer memory systems," IEEE Transactions on Information Theory USA, vol. 41, No. 2, Mar. 1995, pp. 584-591.

(Continued)

Primary Examiner — Fritz Alphonse
(74) Attorney, Agent, or Firm — Baker Hostetler LLP

(57) ABSTRACT

An error-correcting coding method generates code words of m bits from useful data blocks of n bits. The method adds k check bits to a block of n useful data bits in order to generate a code word of m=n+k bits, said check bits being defined according to the combination rules defined by a parity matrix H consisting of binary elements and having k rows and m columns such that H·V=0, V being a column matrix whose m elements are the m bits of the code word to be generated. The k check bits are separated into two groups, on the one hand a group of k1 bits called total parity bits PT and on the other hand a group of k2 bits called conventional check bits VC, the values of k, k1 and k2 satisfying the conditions k=k1+k2 and k>k1>2, the matrix H whose columns can be swapped being broken down into six submatrices A, B, C, D, E and F. Another method detects multiple errors in code words generated by the coding method.

7 Claims, 6 Drawing Sheets

(56) References Cited

U.S. PATENT DOCUMENTS

| | | | |
|---|---|---|---|
| 4,606,026 A * | 8/1986 | Baggen | 714/755 |
| 4,868,827 A * | 9/1989 | Yamada et al. | 714/756 |
| 5,922,080 A * | 7/1999 | Olarig | 714/767 |
| 2005/0149833 A1 | 7/2005 | Worley et al. | |

FOREIGN PATENT DOCUMENTS

| | | |
|---|---|---|
| FR | 2074917 | 10/1971 |
| FR | 2823035 A1 | 10/2002 |

OTHER PUBLICATIONS

Ghosh S. et al.: "Reducing power consumption in memory ECC checkers," Proceedings. International Test Conference 2004 (IEEE CAT. No. 04CH37586) IEEE Piscataway, NJ, USA, 2004, pp. 1322-1331.

Kaneda S. ED—Institute of Electrical and Electronics Engineers: "A Class of Odd-Weight-Column SEC-DED-SBED Codes for Memory System Applications," International Symposium on Fault Tolerant Computing Systems. (FTCS). Kissimmee, Florida, Jun. 20-22, 1984; [International Symposium on Fault Tolerant Computing Systems. (FTCS)], Silver Spring, IEEE Comp. Soc. Press, US, vol. Symp. 14, Jun. 1, 1984, pp. 88-93.

* cited by examiner

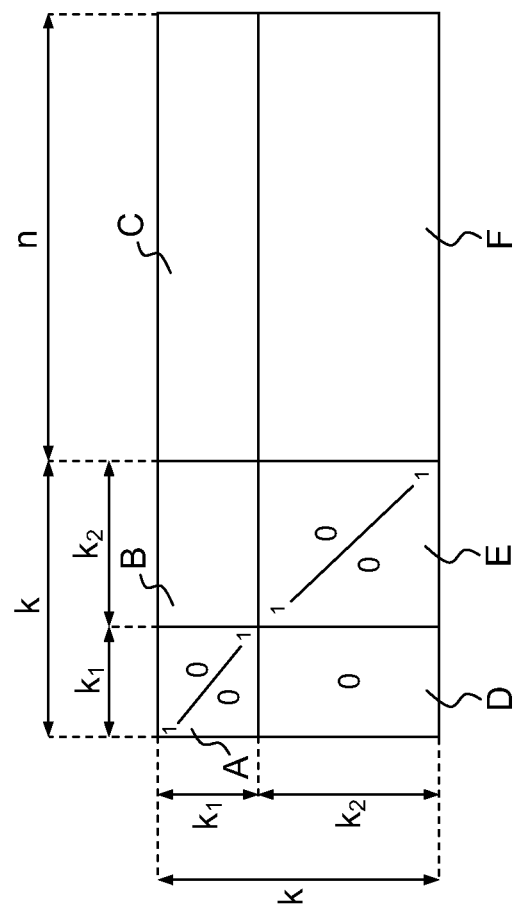

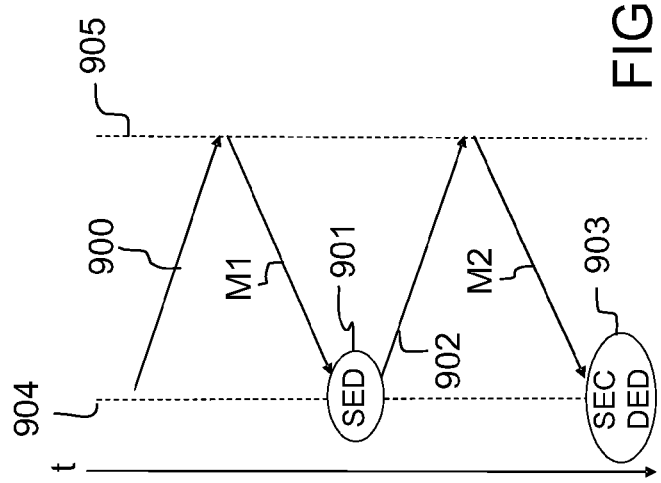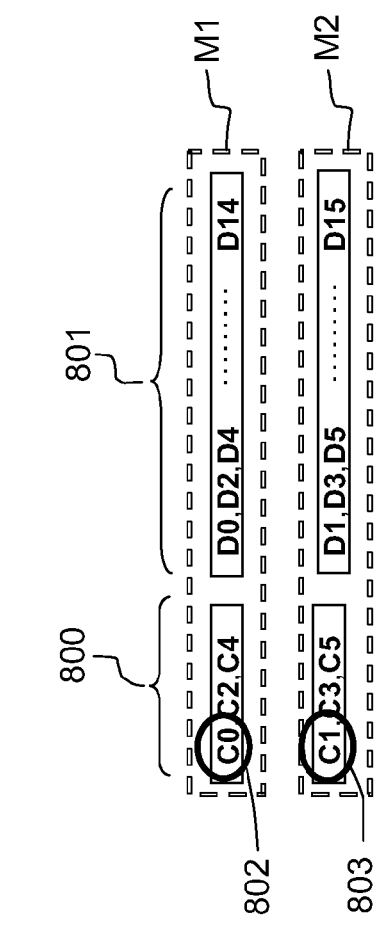

| | C0 | C1 | C2 | C3 | C4 | C5 | D0 | D1 | D2 | D3 | D4 | D5 | D6 | D7 | D8 | D9 | D10 | D11 | D12 | D13 | D14 | D15 |
|---|---|---|---|---|---|---|---|---|---|---|---|---|---|---|---|---|---|---|---|---|---|---|
| | 1 | 0 | 0 | 1 | 0 | 0 | 1 | 0 | 0 | 1 | 0 | 0 | 1 | 0 | 0 | 1 | 0 | 0 | 1 | 0 | 0 | 1 |
| | 0 | 1 | 0 | 1 | 1 | 0 | 0 | 1 | 0 | 1 | 1 | 0 | 0 | 1 | 0 | 0 | 1 | 0 | 0 | 1 | 0 | 0 |
| | 0 | 0 | 1 | 0 | 0 | 1 | 0 | 0 | 1 | 0 | 0 | 1 | 0 | 0 | 1 | 0 | 0 | 1 | 0 | 0 | 1 | 0 |
| | 0 | 0 | 0 | 1 | 0 | 0 | 0 | 1 | 0 | 0 | 1 | 0 | 1 | 1 | 1 | 1 | 1 | 0 | 1 | 0 | 1 | 1 |
| | 0 | 0 | 0 | 0 | 1 | 0 | 1 | 0 | 1 | 1 | 0 | 0 | 1 | 0 | 1 | 1 | 0 | 1 | 0 | 1 | 1 | 1 |
| | 0 | 0 | 0 | 0 | 0 | 1 | 1 | 0 | 0 | 0 | 0 | 1 | 0 | 1 | 0 | 0 | 1 | 1 | 1 | 0 | 1 | 0 |

FIG.10

| | C0 | C1 | C2 | C3 | C4 | C5 | C6 | D0 | D1 | D2 | D3 | D4 | D5 | D6 | D7 | D8 | D9 | D10 | D11 | D12 | D13 | D14 | D15 |
|---|---|---|---|---|---|---|---|---|---|---|---|---|---|---|---|---|---|---|---|---|---|---|---|
| | 1 | 0 | 0 | 0 | 1 | 0 | 0 | 0 | 0 | 0 | 1 | 0 | 0 | 0 | 1 | 0 | 1 | 0 | 0 | 0 | 0 | 0 | 0 |
| | 0 | 1 | 0 | 0 | 0 | 1 | 0 | 0 | 1 | 1 | 0 | 0 | 0 | 1 | 0 | 0 | 0 | 1 | 1 | 0 | 1 | 1 | 1 |
| | 0 | 0 | 1 | 0 | 0 | 0 | 1 | 1 | 0 | 0 | 1 | 0 | 0 | 0 | 1 | 1 | 0 | 0 | 0 | 1 | 0 | 0 | 1 |
| | 0 | 0 | 0 | 1 | 0 | 0 | 0 | 0 | 0 | 0 | 0 | 1 | 0 | 1 | 1 | 0 | 0 | 1 | 0 | 0 | 1 | 1 | 0 |
| | 0 | 0 | 0 | 0 | 1 | 0 | 0 | 0 | 0 | 1 | 0 | 1 | 1 | 0 | 0 | 0 | 1 | 1 | 1 | 1 | 0 | 0 | 1 |
| | 0 | 0 | 0 | 0 | 0 | 1 | 0 | 1 | 1 | 1 | 0 | 0 | 0 | 0 | 0 | 1 | 1 | 0 | 0 | 0 | 1 | 1 | 1 |
| | 0 | 0 | 0 | 0 | 0 | 0 | 1 | 0 | 0 | 1 | 1 | 0 | 0 | 1 | 0 | 0 | 1 | 0 | 1 | 1 | 0 | 1 | 0 |

FIG.11

ERROR-CORRECTING ENCODING METHOD WITH TOTAL PARITY BITS, AND METHOD FOR DETECTING MULTIPLE ERRORS

CROSS-REFERENCE TO RELATED APPLICATIONS

This application is a National Stage of International patent application PCT/EP2010/051192, filed on Feb. 1, 2010, which claims priority to foreign French patent application No. FR 09 00448, filed on Feb. 3, 2010, the disclosures of which are incorporated by reference in their entirety.

FIELD OF THE INVENTION

The invention relates to an error-correcting coding method with total parity bits and a method for detecting multiple errors. It applies notably to the fields of digital electronics and telecommunications. The invention can be used, for example, in digital systems equipped with a memory or in interconnect systems.

BACKGROUND OF THE INVENTION

In digital electronics, the data, also called information or messages, are stored and transmitted in the form of binary values on bits. During storage or transmission, these values may be corrupted.

To maintain the level of integrity of the data or to increase production efficiency, some electronic systems use error-correcting codes, called ECCs. In an electronic circuit, the errors that appear in the data may be temporary or permanent. The temporary errors are produced by environmental interferences or are generated by the radioactivity of certain impurities in the material of the electronic circuits. The permanent errors are due to defects in the physical structure of the circuit occurring in production or as a result of the aging of the circuit.

In the systems that use an ECC protection, the data are encoded. The encoding operation, also called coding operation, results in code words containing said data to which are added check bits calculated according to a matrix selected for this coding. This matrix is usually called parity matrix.

In a second stage, the coded word is decoded to produce the original datum. For this, a check vector, called syndrome, is calculated. This syndrome is used to detect and correct potential errors appearing in a given code word. If no error is detected, the coded word is considered correct. If an error that can be corrected is detected, the coded word is corrected. Finally, if an uncorrectable error is detected, this is indicated.

For the storage or transmission of data, codes that have a SECDED (Single Error Correction, Double Error Detection) capability are normally used. As their name indicates, these codes are capable of correcting an error and of detecting a multiple error affecting two bits of a code word. A multiple error is used hereinafter in the description to designate an error affecting several bits of one and the same code word. The codes that allow for the correction of multiple errors are very costly in terms of computation and are rarely used to make the data storage reliable for example.

The use of a SECDED code involves a number of types of operations, notably computation, monitoring, manipulation and storage operations. Implementing such codes consequently consumes considerable circuit surface area, electrical energy/power and computation performance. It is therefore necessary to have powerful error-correcting codes and suitable coding and decoding devices.

SUMMARY OF THE INVENTION

One aim of the invention is notably to overcome the above-mentioned drawbacks.

To this end, the subjects of the invention are an error-correcting coding method generating code words of m bits from useful data blocks of n bits, said method adding k check bits to a block of n useful data bits in order to generate a code word of m=n+k bits, said check bits being defined according to the combination rules defined by a parity matrix H consisting of binary elements and having k rows and m columns such that H·V=0, V being a column matrix whose m elements are the m bits of the code word to be generated. The k check bits are separated into two groups, on the one hand a group of k1 bits called total parity bits PT and on the other hand a group of k2 bits called conventional check bits VC, the values of k, k1 and k2 satisfying the conditions k=k1+k2 and k>k1≥2. The matrix H whose columns can be swapped is broken down into six submatrices A, B, C, D, E and F.

The submatrix A is a square matrix consisting of the binary elements at the intersection of the first k1 columns and of the first k1 rows of the matrix H, the submatrix A being a unity matrix.

The submatrix B consists of the binary elements at the intersection of the columns k+1 to k1+k2 and of the first k1 rows of the matrix H and comprises an odd number of 1s per column.

The submatrix C consists of the binary elements at the intersection of the last n columns and of the first k1 rows of the matrix H and comprises an odd number of 1s per column.

The submatrix D consists of the binary elements at the intersection of the first k1 columns and of the last k2 rows of the matrix H and is a zero matrix.

The submatrix E is a square matrix consisting of the binary elements at the intersection of the columns k1+1 to k1+k2 and of the last k2 rows of the matrix H and is a unity matrix.

The submatrix F consists of the binary elements at the intersection of the last n columns and of the last k2 rows of the matrix H such that the columns of the matrix H are different.

According to one aspect of the invention, the matrix resulting from the merging of the three submatrices A, B, C of the parity matrix H and called parity submatrix is constructed such that each column includes a 1.

According to another aspect of the invention, the columns of the parity matrix H of the code are swapped so that a code word generated by the method according to the invention consists of a number of contiguous subsets of bits, each subset of bits comprising at least one of the total parity bits PT.

Another subject of the invention is a method for detecting multiple errors in code words generated by the coding method described previously. It comprises a step for determining a syndrome, the syndrome of a code word being the result of a logical exclusive OR applied bit-by-bit between the check bits of the code word on which the detection is made and the check bits recalculated from the bits of the code word on which the detection is made.

The method for detecting multiple errors comprises, for example, a step for checking the syndrome leading to the calculation of an indicator EM1, said calculation being carried out if the number of 1s contained in the syndrome is different from 0, the indicator EM1 taking the value 1 when a multiple error is detected and being defined by the expression:

$$EM1 = \left(\bigoplus_{i=0}^{k1-1} Si\right) \wedge \left(\bigvee_{j=0}^{k-1} Sj\right)$$

in which:
∨ indicates a logical OR operation;
∧ indicates a logical AND operation;
⊕ represents the logical exclusive OR operation;
$Si$ represents the $i^{th}$ bit of the syndrome;
$Sj$ represents $j^{th}$ bit of the syndrome;
k represents the number of syndrome bits;
k1 represents the number of PTC bits;
$\bar{x}$ represents the complement of x.

The method for detecting multiple errors comprises, for example, a step for checking the syndrome leading to the calculation of an indicator EM2, said calculation being carried out if the bits of the syndrome corresponding to the bits PT form a combination not used for the identification of single errors, the indicator EM2 taking the value 1 when a multiple error is detected and being defined by the expression:

$$EM2 = \bigvee_{\delta \in \Delta} \left[\left(\bigwedge_{i=0 \text{ with } \delta(i)=1}^{k1-1} Si\right) \wedge \left(\bigwedge_{i=0 \text{ with } \delta(i)=0}^{k1-1} \overline{Si}\right)\right]$$

in which:
$\delta$: $\{0, 1, \ldots, k1-1\} \to \{0, 1\}$ is a function indicating a combination of the k1 bits PT of the syndrome in which the complement of the bits Si is taken if $\delta(i)=0$;
$\Delta$ is the set of combinations $\delta$ not used for the identification of single errors.

The method for detecting multiple errors comprises, for example, a step for checking the syndrome leading to the calculation of an indicator EM3, said calculation being carried out if the bits of the syndrome corresponding to the bits VC form a combination not used for the identification of single errors, the indicator EM3 taking the value 1 when a multiple error is detected and being defined by the expression:

$$EM3 = \bigvee_{\pi \in \Pi} \left[\left(\bigwedge_{i=k1 \text{ with } \pi(i)=1}^{k-1} Si\right) \wedge \left(\bigwedge_{i=k1 \text{ with } \pi(i)=0}^{k-1} \overline{Si}\right)\right]$$

in which:
$\pi$: $\{k1, k1+1, k-1\} \to \{0, 1\}$ is a function indicating a combination of the k2 bits VC of the syndrome in which the complement of the bits Si is taken if $\pi(i)=0$;
Π is the set of combinations π not used for the identification of single errors.

BRIEF DESCRIPTION OF THE DRAWINGS

Other features and advantages of the invention will become apparent from the following description, given as a nonlimiting illustration, and in light of the appended drawings in which:

FIG. 2 gives an example of a parity matrix for an extended Hamming code;
FIG. 3 gives an example of a parity matrix for a Hsiao code;
FIG. 4 illustrates the characteristics of the parity matrices representative of the coding method according to the invention;
FIG. 5 gives an example of a parity matrix of a BPT code;
FIG. 6 shows a parity matrix corresponding to an example of a BPTC code with 2 complementary total parity bits;
FIG. 7 shows a parity matrix corresponding to an example of a BPTC code with 2 complementary total parity bits and in which the bits of a code word can be split into two subsets;
FIG. 8 gives an example of separation of a code word generated by the method according to the invention into two subsets;
FIG. 9 gives an example of a protocol that can be used to exploit the property of separation into subsets of a code word generated by the method according to the invention;
FIG. 10 shows an example of a parity matrix of a BPTC code with 3 complementary total parity bits;
FIG. 11 shows an example of a parity matrix of a BPTC code with 4 complementary total parity bits.

DETAILED DESCRIPTION

Figure 1:
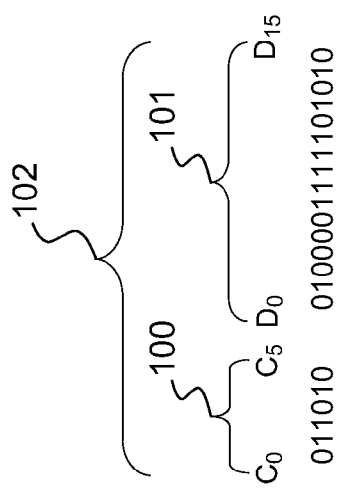
FIG. 1 gives an example of a code word and introduces the associated notations.

FIG. 1 gives an example of a code word and introduces the associated notations. The SECDED codes are separable codes, that is to say codes in which the check bits 100 are added to the information bits 101. These check bits can be used to detect and/or correct any errored bits in said code word. As explained previously, these errored bits may occur as a result of disturbances occurring notably during the transmission of the code word or during storage. In the example of the figure, six check bits 100 denoted C0 to C5 are added to the 16 information bits 101 denoted D0 to D15. The set consisting of the information bits and of the check bits forms a code word 102. In the context of this example, the code word has 22 bits.

FIG. 2 gives an example of a parity matrix for an extended Hamming code. The SECDED codes ensure the detection of double errors by imposing a fixed total parity on the coded word. The extended Hamming codes and the Hsiao code are the SECDED codes that are most commonly used. They are linear codes and they can therefore be described using the parity matrix of the code. Each row corresponds to a check bit and each column to a useful information bit or to a check bit depending on its position. A 1 situated at the intersection of a row and a column in the parity matrix of the code indicates a dependency between the corresponding bits. Conversely, a 0 indicates an independency. The check bits are calculated using modulo 2 sums on the dependency bits indicated by the row of the parity matrix which corresponds to the check bit concerned.

The extended Hamming codes are described notably in the book by P. K. Lala entitled *Self-Checking and Fault-Tolerant Design*, San-Francisco, Morgan Kaufmann, 2001. These Hamming codes are said to be extended because a check bit has been added to the conventional Hamming code. The purpose of this check bit is to check the total parity of the code word.

The parity matrix of FIG. 2 corresponds to an example of an extended Hamming code for which each code word comprises 16 information bits denoted D0 to D15 and 6 check bits denoted C0 to C5. The parity matrix of this code therefore comprises 6 rows and 22 columns. Among these columns, 6 columns 200 correspond to the check bits and 16 columns 201 correspond to the data bits. The check bit C0 is the bit checking the overall parity of the code word, also called total parity hereinafter in the description. The first row of the matrix 202 is consequently filled with 1s.

FIG. 3 gives an example of a parity matrix for a Hsiao code. As introduced previously, Hsiao codes are SECDED codes that are commonly used. These codes are notably described in the article by C. L. Chen and M. Y. Hsiao entitled *Error-correcting codes for semiconductor memory applications: a state of the art review*, Reliable Computer Systems—Design and Evaluation, Digital Press, 2nd edition, 1992, pages 771-786.

Unlike the extended Hamming codes that have a single bit to check the parity of all of the coded word, in the Hsiao codes all the check bits are used to impose the parity of all of the coded word. For this, the Hsiao codes are constructed by imposing an odd number of 1s for each column of the parity matrix of the code. The parity matrix of FIG. 3 corresponds to an example of a Hsiao code.

Each code word comprises 16 information bits denoted D0 to D15 and six check bits denoted C0 to C5. Consequently, 6 columns 300 correspond to the check bits and 16 columns 301 correspond to the data bits.

FIG. 4 illustrates the characteristics of the parity matrices representative of the coding method according to the invention. The error-correcting code family evolving from the invention is hereinafter in the description called code with total parity bits and designated by the acronym BPT.

Hereinafter in the description, the syndrome of a code word is defined as being the result of a logical exclusive OR applied bit-by-bit between the check bits and the check bits recalculated on the basis of the data bits of the code word to be decoded. This operation can be expressed using the following equation:

$$(S0, S1, \ldots, Sk-1) = (C0', C1', \ldots, Ck-1') \oplus (C0'', C1'', Ck-1'') \quad (1)$$

in which:
$\oplus$ represents the logical exclusive OR operation;
$Si$ represents the $i^{th}$ bit of the syndrome;
$Ci'$ represents the $i^{th}$ check bit of the code word to be decoded;
$Ci''$ represents the $i^{th}$ check bit recalculated on the basis of the data bits of the code word to be decoded;
$k$ is the number of check bits of the code word.

The coding method and the family of codes that are associated with it proposed in the context of the invention allow for the use of all the check bits in order to draw a distinction between the syndromes corresponding to the errored bits. Such is the case of the Hsiao code, but is not the case with the extended Hamming code in which the total parity bit is used to distinguish the syndrome indicating an error on this same bit.

The parity matrix H used by the coding method according to the invention can be broken down into six submatrices A, B, C, D, E and F. To code the useful blocks of information of n bits by adding k check bits, a parity matrix comprising m=k+n columns and k rows is used. The check bits are split into two groups, on the one hand a group of k1 bits called total parity bits and on the other hand a group of k2 bits called conventional check bits, with k1+k2=k. Hereinafter in the description, the total parity bits are designated by the acronym PT and the conventional check bits are designated by the acronym VC.

The submatrix A is a square matrix consisting of the binary elements at the intersection of the first k1 columns and of the first k1 rows of the matrix H. The submatrix A is a unity matrix, that is to say that it consists of zeroes except on its downward diagonal.

The submatrix B consists of the binary elements at the intersection of the columns k1+1 to k1+k2 and of the first k1 rows of the matrix H.

The submatrix C consists of the elements at the intersection of the last n columns and of the first k1 rows of the matrix H.

The submatrices B and C are constructed by guaranteeing an odd number of 1s for each column of said matrices.

The submatrix D consists of the binary elements at the intersection of the first k1 columns and of the last k2 rows of the matrix H. The submatrix D is a zero matrix, that is to say that it consists only of zeroes.

The submatrix E is a square matrix consisting of the binary elements at the intersection of the columns k1+1 to k1+k2 and of the last k2 rows of the matrix H. The submatrix E is a unity matrix, that is to say that it consists of zeroes except on its downward diagonal.

The submatrix F consists of the binary elements at the intersection of the last n columns and of the last k2 rows of the matrix H. The submatrix F is constructed such that the columns of the matrix H are different.

To generate code words by using the method according to the invention, the parity matrix must be constructed such that k and k1 satisfy the following inequality:

$$k > k1 > 2 \quad (2)$$

The submatrix defined by the merging of the matrices A, B and C is called parity submatrix of the code. By constructing the matrix H according to the rules explained above, each column of the parity submatrix includes an odd number of 1s.

Unlike the Hsiao code, the new code allows for the existence of columns with an even number of 1s in the portion of the matrix of the code corresponding to the useful information bits, that is to say the portion corresponding to the submatrices C and F. This property is reflected, when the code is implemented on a coding circuit, in a reduction of the silicon surface area, for example, and allows for an increase in performance in terms of speed of execution of the encoder and of the decoder.

In addition to the conventional SECDED capability, special variations of the new BPT code allow for the effective detection of multiple errors, that is to say errors involving the corruption of multiple bits of the code word. Within the meaning of this definition, double errors are considered as a particular case of multiple errors.

At least two types of multiple errors can be distinguished. Hereinafter in the description, the first type is called "burst error" and the second "range error". A burst error affects a group of m adjacent bits corresponding to adjacent columns in the parity matrix of the code. For example if the bits D0, D1, D2 are D3 are false, that is a burst error of length 4 and this error will be denoted burst (4).

An error that affects the bits D0, D2, D3 and D4 is not a burst error. A range error is an error that affects i bits in a group of j adjacent bits (i≤j). This type of error is designated by the notation range (i, j). For example, the error that affects the bits D0, D2, D3 and D4 is an error designated range (4, 5).

Hereinafter in the description, it is considered that if a code can detect all the errors of burst (I) and range (i, j) type, then all the burst (I') and range (i', j') errors can also be detected with the conditions I'≤I, i'≤i and j'≤j. In addition, a burst (I) error is included in range (i, j) if I≤i.

Figures 5, 6:
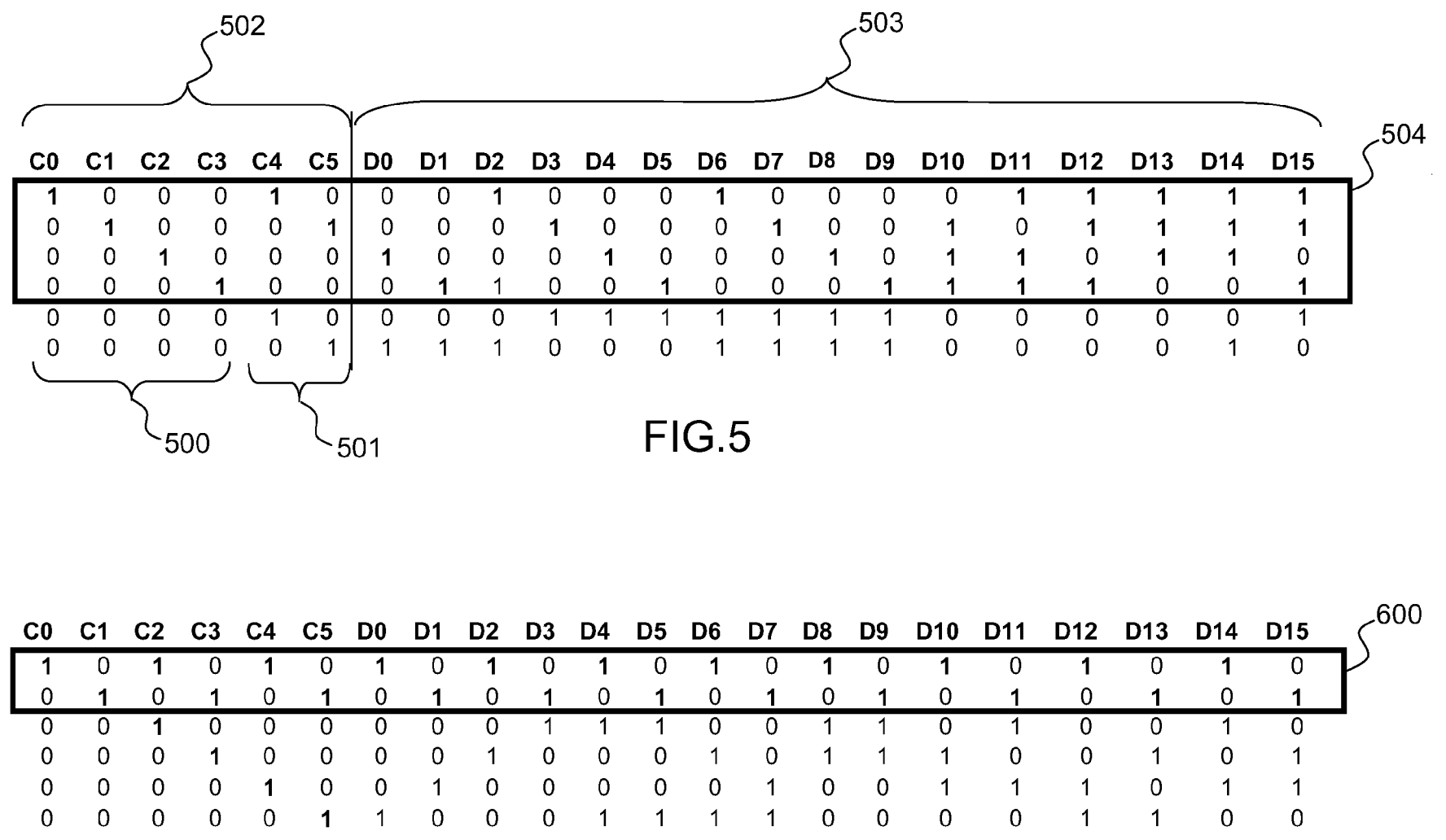

FIG. 5 gives an example of a parity matrix of a BPT code. In this example, a code word comprises 16 useful information bits 503 denoted D0 to D15. The six check bits 502, C0, C1, C2, C3, C4 and C5, are divided into two groups. The first group 500 comprises four total parity bits C0, C1, C2, C3. The second group 501 comprises two conventional check bits C4 and C5. The parameters defined previously therefore take the values k=6, k1=4 and k2=2 and n=16. The parity submatrix consequently comprises 4 rows and 22 columns.

From the BPT code according to the invention, particular cases that have interesting properties in terms of error detection can be distinguished. As an example, codes called codes with complementary total parity bits and designated by the acronym BPTC are described hereinafter in the description.

FIG. 6 shows a parity matrix corresponding to an example of a BPTC code comprising two complementary bits PT.

These codes are a particular case of the BPT codes and are constructed by adding an additional constraint on construction of the parity matrix. This constraint is that each column of the parity submatrix should have only a single 1. The set of the bits of the coded word is then partitioned into a number of subsets, such that, for each subset, there is a check bit, said check bit making it possible to ensure the parity of this subset.

These check bits are called complementary total parity bits and are designated by the acronym PTC. They are so named because the subsets of bits of the code word for which they ensure the parity are complementary. In other words, the rows of the parity submatrix have two properties.

The first is that the columns of the parity submatrix have only a single 1.

The second is that the addition of the k1 row matrices of length m=k+n corresponding to the k1 rows of the parity submatrix is equal to a row matrix filled with 1s.

The matrix of FIG. 6 is an example of a parity matrix for a BPTC code using two PTC bits. The two PTC bits C0 and C1 are used to cover all the code word. The first two rows of the matrix of the code corresponding to C0 and C1 each cover the parity of half of the bits of the code word. Thus, two errors on two adjacent bits are easily detected by the relative dependencies on the parities of C0 and C1. In this example, the parity submatrix 600 comprises two rows and the same number of columns as the entire parity matrix.

FIG. 7 shows a parity matrix corresponding to example of a code with two PTC bits and whose code words can be split into two contiguous subsets. As it happens, the columns of the parity matrix of a BPTC code can be swapped. Thus, the columns of the parity matrix of FIG. 6 have been reordered in order for the two subsets 701, 702 of the coded word to be easier to split. Each of the two PTC bits C0 and C1 allows for the detection of single errors, as well as all the errors that affect an odd number of bits, and does so in each subset 701, 702 by reading only this subset. The reading of the entire coded word for its part offers the SECDED capability. This split is apparent in the parity submatrix 700 in which the 1s of the two rows corresponding to the PTC bits are grouped together at the level of each subset 701, 702.

FIG. 8 gives an example of separation of a code word generated by the method according to the invention into two subsets M1, M2. In other words, a code word is cut into two words M1, M2 to be stored and/or transmitted over a communication medium. The example of FIG. 8 evolves from the parity matrix shown using FIG. 7. The two subsets resulting from the subdividing of a code word comprise three check bits 800 and eight data bits 801. Each subset comprises, in this example, one PT bit 802, 803 out of its check bits. In one example of implementation, the subsets M1, M2 of the code word are placed in a memory in which the width of a memory word is that of a subset. The two subsets of the code word are then placed in two different words of the memory or/and transmitted over a medium which transports the bits, for example, with the granularity of a subset of the coded word.

The reading of just one of the words in the memory benefits from the Single Error Detection SED capability, and does so by virtue of the presence of the PT bit 802, 803 of each subset. The reading of all the memory words corresponding to the subsets of one and the same code word benefits from the SECDED capability.

FIG. 9 gives an example of a protocol that allows the property of separation into subsets of a code word generated by the method according to the invention to be exploited. An example of exchanges that may be implemented between a master equipment item 904 wanting to access data, which equipment item is contained in a memory 905, is explained below. The exchanges of control and data messages are performed, for example, by using a bus.

The master equipment item 904 sends a read request 900. In response, the first subset M1 of a code word stored in memory 905 is sent to the master equipment item. The detection of an error can be done as soon as a single subset is accessed instead of having to wait for access to all of a code word. An error detection SED 901 is performed. The detection of an error can therefore be done rapidly. Thus, the access to all the coded word may be performed only when it is necessary to access all the data that it contains, or else to correct an error that has been detected in one of the subsets. In the example of the figure, a second request 902 is sent in order to access the second subset M2 of the code word. Said subset is then sent to the master equipment item and the code word received benefits in its entirety from the single error correction capability and from the multiple error detection 903 of the method according to the invention.

FIG. 10 shows a parity matrix corresponding to an example of a BPTC code with three PTC bits. It is possible to construct parity matrices to generate codes according to the invention by using, for example, three or more PTC bits. In the example of the figure, C0, C1 and C2 are the complementary total parity bits. C3, C4 and C5 are the bits VC. To generate, for example, code words comprising 16 useful information bits denoted D0 to D15, the parity submatrix 1000 comprises 3 rows and 22 columns. In addition to the SECDED capability, it is then possible to detect burst (4) errors, that is to say packets of errors affecting four adjacent bits of a code word. This is done here effectively because only the PTC bits are involved in performing this detection, the bits VC being necessary only for the correction. This can be done while dissociating their syndromes from those of the correctable single errors and thus makes it possible to avoid making wrong corrections.

FIG. 11 shows an example of a parity matrix for a BPTC code using four PTC bits (C0, C1, C2, C3). Said code associates six check bits C0 to C5 with the 16 data bits D0 to D15. The parity submatrix 1100 therefore consists of 22 columns and 4 rows. In addition to the conventional SECDED capability, it is here possible to detect burst (6) and range (4, 4) errors. The syndrome of an errored word affected by these burst or range errors will always have at least two bits equal to 1 in the portion corresponding to the PTC bits.

In the case of a burst (6) error on the bits C5, C6, D0, D1, D2 and D3, the bits of the syndrome corresponding to the PTC bits form a combination not used for the correction of single errors. As it happens, the syndrome corresponding to the PTC bits obtained is in this case:

$$(S0,S1,S2,S3)=(1,0,0,1) \quad (3)$$

In the case of a range (3, 4) error on the bits C5, C6 and D1, the bits of the syndrome corresponding to the PTC bits form a combination not used for the correction of single errors. The syndrome corresponding to the PTC bits below is obtained:

$$(S0,S1,S2,S3)=(1,1,1,0) \quad (4)$$

The coding method according to the invention, whether for BPT or BPTS codes, can be implemented notably in an electronic circuit or a computer.

Figure 12:
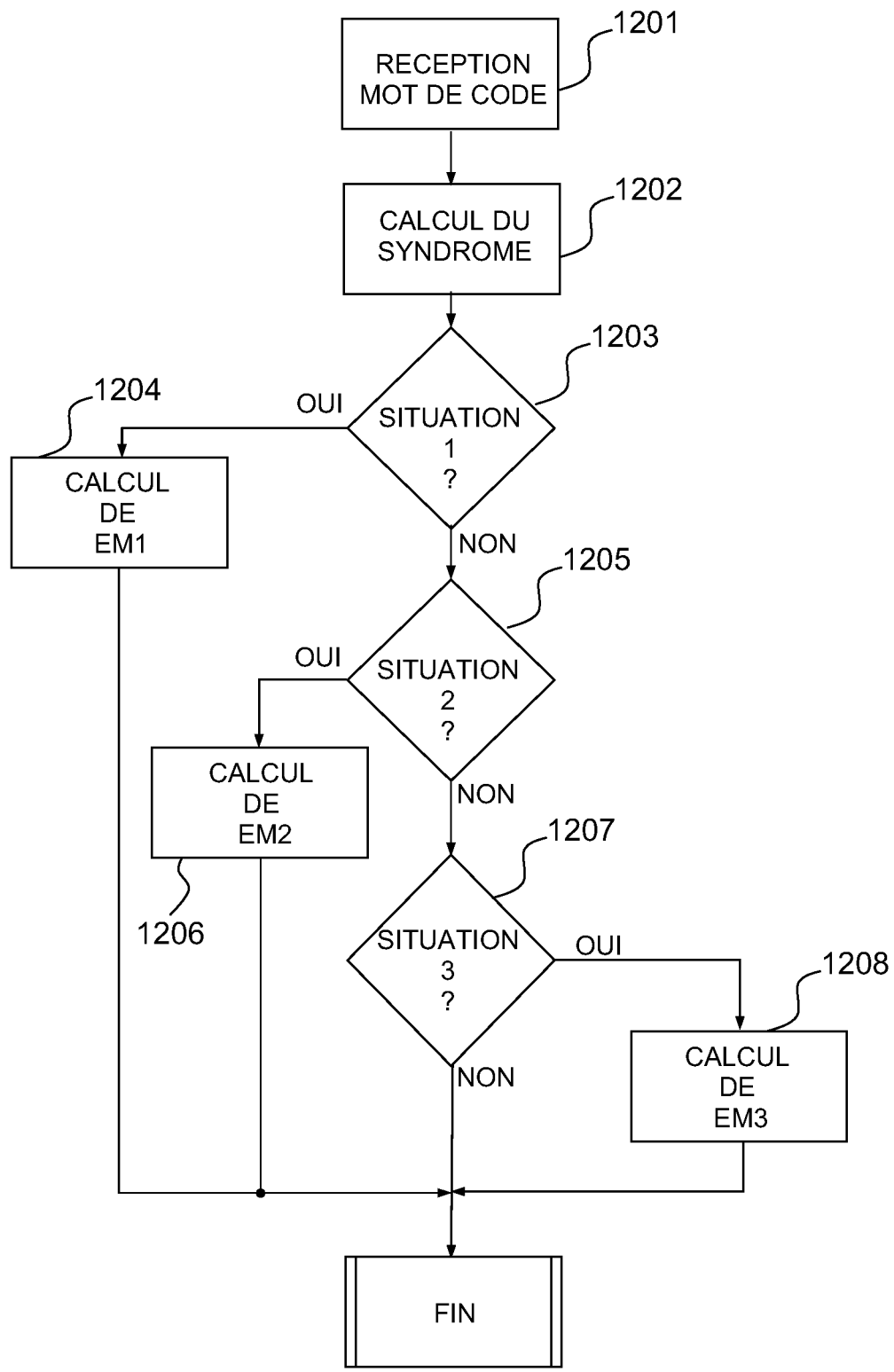
FIG. 12 illustrates an example of a multiple error detection algorithm according to the invention.

FIG. 12 illustrates an example of a multiple error detection algorithm according to the invention.

If the calculated syndrome is zero there is no error detected. In the case of SECDED codes with PTC bits, it is possible to distinguish three easily identifiable cases which denote the presence of a multiple error. The detection algorithm presented using FIG. 12 is designed to detect these three cases. Once the code word is received 1201, the syndrome of said word is calculated 1202, for example, as explained previously in the description.

The first case to be detected corresponds to the situation in which all the bits of the syndrome corresponding to the PTC bits are zero 1203. The number of non-zero bits of the syndrome corresponding to the PTC bits is denoted Nsc. Therefore, if Nsc=0, the first case is detected. In other words, the number of errored bits in each subset of the bits of the coded word depending on one and the same total parity bit is even, but there remain one or more other bits Si of the syndrome that are non-zero. In this case, the presence of multiple errors is detected 1204 when the indicator EM1 defined by the expression below has the value 1:

$$EM1 = \left( \bigvee_{i=0}^{k1-1} Si \right) \wedge \left( \bigvee_{j=k1}^{k-1} Sj \right) \quad (5)$$

in which:
∨ indicates a logical OR operation;
∧ indicates a logical AND operation;
k represents the number of syndrome bits;
k1 represents the number of PTC bits;
$\overline{x}$ represents the complement of x;
Si represents the $i^{th}$ bit of the syndrome;
Sj represents the $j^{th}$ bit of the syndrome.

The second case to be detected 1205 denoting the presence of multiple errors corresponds to the situation for which more than one of the syndrome bits corresponding to the complementary parity bits are non-zero, in other words Nsc>1. Consequently, in a SECDED code with k1 (k1>2) complementary parity bits in which bits of the k1 subsets are interleaved, it is possible to effectively detect all the multiple errors of burst (2×k1−2) type and all the multiple errors of range (k1, k1) type. In these two cases, at least two bits are equal to 1 in the portion of the syndrome corresponding to the complementary parity bits. A multiple error is then detected 1206 when the indicator EM2 defined by the following expression has the value 1:

$$EM2 = \left( \bigvee_{i=0}^{k1-1} Si \right) \wedge \left( \bigvee_{j=i+1}^{k1-1} Sj \right) \quad (6)$$

The third case to be detected 1207 denoting the presence of multiple errors corresponds to the situation in which the syndrome bits corresponding to the bits VC form a combination not used for the identification of single errors. A multiple error is then detected 1208 when the indicator EM3 defined by the following expression has the value 1:

$$EM3 = \bigvee_{\pi \in \Pi} \left[ \left( \bigwedge_{i=k1 \text{ with } \pi(i)=1}^{k-1} Si \right) \wedge \left( \bigwedge_{i=k1 \text{ with } \pi(i)=0}^{k-1} \overline{Si} \right) \right] \quad (7)$$

in which:
π: {k1, k1+1, k−1}→{0, 1} is a function indicating a combination of the k2 bits VC of the syndrome in which the complement of the bits Si(k1≤i<k) is taken if π(i)=0;
Π is the set of combinations π not used for the identification of single errors.

An example of a method for detecting multiple errors in the case of the BPT code is described below. In the case of the BPT codes, three cases denoting the presence of a multiple error are easily identifiable using the calculation of three indicators EM1, EM2 and EM3 defined for the more general case of BPT codes.

In a first case, the code word has the correct total parity, but there are non-zero bits in the set of syndrome bits. In this case, a multiple error is detected by using the following expression:

$$EM1 = \left( \bigoplus_{i=0}^{k1-1} Si \right) \wedge \left( \bigvee_{j=0}^{k-1} Sj \right) \quad (8)$$

In a second case denoting the presence of a multiple error, the syndrome bits which correspond to the bits PT form a combination not used for the identification of single errors.

$$EM2 = \bigvee_{\delta \in \Delta} \left[ \left( \bigwedge_{i=0 \text{ with } \delta(i)=1}^{k1-1} Si \right) \wedge \left( \bigwedge_{i=0 \text{ with } \delta(i)=0}^{k1-1} \overline{Si} \right) \right] \quad (9)$$

in which:
δ: {0, 1, . . . , k1−1}→{0, 1} is a function indicating a combination of the k1 bits PT of the syndrome in which the complement of the bits Si (0≤i≤k1) is taken if δ(i)=0;
Δ is the set of combinations δ not used for the identification of single errors.

In a third case denoting the presence of a multiple error, the syndrome bits corresponding to the bits VC form a combination not used for the identification of single errors. This detection is done in the manner described by equation (7).

The method for detecting multiple errors according to the invention can be implemented notably in an electronic circuit or a computer.

The hardware implementation of the expressions (5), (6) and (8) is obvious to those skilled in the art. The effectiveness of the implementations of the expressions (7) and (9) is facilitated by the fact that the first does not depend on the parity bits and by the fact that the second depends only on the parity bits. In addition, above all in the case of the expression (7), only a subset of the combinations not used for the identification of single errors can be used for the identification of multiple errors.

For the detection of double errors in the case of the Hsiao code, the total parity can be calculated notably by using two distinct methods. In the first method, a logical exclusive OR is applied between all the bits of the syndrome which has a negative impact on the computation performance levels of the decoder. In the second method, a logical exclusive OR is applied between all the bits of the code word to be decoded which has a negative impact on the surface area of the decoding circuit.

These two drawbacks do not arise in the case of the BPTC codes and in certain BPT code cases.

The invention claimed is:

1. An error-correcting coding method for generating code words of m bits from useful data blocks of n useful data bits, said method comprising:
   adding, using a processing circuit, k check bits to a block of n useful data bits in order to generate a code word of m=n+k bits, said k check bits being defined according to combination rules defined by a parity matrix H consisting of binary elements and having k rows and m columns such that H·V=0, wherein V is a column matrix whose m elements are the m bits of the code word to be generated, and m, n and k are each integers,
   separating, using the processing circuit, the k check bits into first and second groups, the first group including k1 bits called total parity bits PT and the second group including k2 bits called conventional check bits VC, wherein k, k1 and k2 satisfy conditions k=k1+k2 and k>k1>2, and
   breaking down, using the processing circuit, the parity matrix H into six submatrices A, B, C, D, E and F, wherein:
   the submatrix A is a square matrix comprising binary elements at an intersection of first k1 columns and of the first k1 rows of the matrix H, the submatrix A being a unity matrix;
   the submatrix B comprises binary elements at an intersection of columns k1+1 to k1+k2 and the first k1 rows of the matrix H, and comprises an odd number of 1s per column;
   the submatrix C comprises binary elements at an intersection of last n columns and the first k1 rows of the matrix and comprises an odd number of 1s per column;
   the submatrix D comprises binary elements at an intersection of the first k1 columns and of the last k2 rows of the matrix H, and is a zero matrix;
   the submatrix E is a square matrix comprising binary elements at an intersection of the columns k1+1 to k1+k2 and the last k2 rows of the matrix H, and is a unity matrix; and
   the submatrix F comprises binary elements at an intersection of the last n columns and the last k2 rows of the matrix H, such that the columns of the matrix H each differ.

2. The method according to claim 1, wherein a matrix resulting from merging of the three submatrices A, B, C of the parity matrix H is called a parity submatrix and is constructed such that each column includes a 1.

3. The method according to claim 2, wherein the columns of the parity matrix H are swapped so that a generated code word comprises a number of contiguous subsets of bits, each contiguous subset of bits comprising at least one of the total parity bits PT.

4. The method according to claim 1, further comprising:
   detecting errors, using the processing circuit, in the code words by determining a syndrome, the syndrome of a code word resulting from a logical exclusive OR applied bit-by-bit between the k check bits of the code word and check bits recalculated from the bits of the code word.

5. The method according to claim 4, further comprising:
   checking the syndrome leading to a calculation of an indicator EM1, said calculation being carried out if the number of 1s contained in the syndrome is different from 0, the indicator EM1 taking the value 1 when a multiple error is detected and being defined by:

$$EM1 = \left( \bigoplus_{i=0}^{k1-1} Si \right) \wedge \left( \bigvee_{j=01}^{k-1} Sj \right)$$

in which:
∨ indicates a logical OR operation;
∧ indicates a logical AND operation;
⊕ represents a logical exclusive OR operation;
Si represents an $i^{th}$ bit of the syndrome;
Sj represents a $j^{th}$ bit of the syndrome;
k represents a number of syndrome bits;
k1 represents a number of PTC bits; and
$\bar{x}$ represents the complement of x.

6. The method according to claim 4, further comprising:
   checking the syndrome leading to a calculation of an indicator EM2, said calculation being carried out if the bits of the syndrome corresponding to the total parity bits PT form a combination not used for identification of single errors, the indicator EM2 taking the value 1 when a multiple error is detected and being defined by the expression:

$$EM2 = \bigvee_{\delta \in \Delta} \left[ \left( \bigwedge_{\substack{i=0 \\ with\ \delta(i)=1}}^{k1-1} Si \right) \wedge \left( \bigwedge_{\substack{i=0 \\ with\ \delta(i)=0}}^{k1-1} \overline{Si} \right) \right]$$

in which
δ: {0, 1, . . . , k1−1}→{0, 1} is a function indicating a combination of the k1 bits PT of the syndrome in which the complement of the bits Si is taken if δ(i)=0; and
Δ is a set of combinations δ not used for the identification of single errors.

7. The method according to claim 4, further comprising:
   checking the syndrome leading to a calculation of an indicator EM3, said calculation being carried out if the bits of the syndrome corresponding to the conventional check bits VC form a combination not used for identification of single errors, the indicator EM3 taking the value 1 when a multiple error is detected and being defined by:

$$EM3 = \bigvee_{\pi \in \Pi} \left[ \left( \bigwedge_{\substack{i=k1 \\ with\ \pi(i)=1}}^{k-1} Si \right) \wedge \left( \bigwedge_{\substack{i=k1 \\ with\ \pi(i)=0}}^{k-1} \overline{Si} \right) \right]$$

in which:
π: {k1, k1+1, . . . , k−1}→{0, 1} is a function indicating a combination of the k2 bits VC of the syndrome in which the complement of the bits Si is taken if π(i)=0; and
Π is a set of combinations π not used for the identification of single errors.

* * * * *